United States Patent
Gehring et al.

(10) Patent No.: US 7,754,555 B2
(45) Date of Patent: Jul. 13, 2010

(54) TRANSISTOR HAVING A CHANNEL WITH BIAXIAL STRAIN INDUCED BY SILICON/GERMANIUM IN THE GATE ELECTRODE

(75) Inventors: Andreas Gehring, Dresden (DE); Ralf Van Bentum, Moritzburg (DE); Markus Lenski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 640 days.

(21) Appl. No.: 11/674,713

(22) Filed: Feb. 14, 2007

(65) Prior Publication Data

US 2008/0001178 A1    Jan. 3, 2008

(30) Foreign Application Priority Data

Jun. 30, 2006    (DE) .................. 10 2006 030 264

(51) Int. Cl.
  *H01L 21/8238*    (2006.01)
(52) U.S. Cl. .................. 438/199; 438/279; 438/303; 257/274; 257/E21.051; 257/E21.054; 257/E21.431
(58) Field of Classification Search .................. 438/199, 438/230, 279, 303, 308, 514, 530; 257/262, 257/274, 279, 347, 369, E21.051, E21.054, 257/E21.06, E21.431
See application file for complete search history.

(56) References Cited

U.S. PATENT DOCUMENTS

| 6,165,826 | A | 12/2000 | Chau et al. | 438/231 |
|---|---|---|---|---|
| 7,244,654 | B2 * | 7/2007 | Chidambaram et al. | 438/300 |
| 2005/0064646 | A1 | 3/2005 | Chidambarrao et al. | 438/221 |
| 2005/0224798 | A1 | 10/2005 | Buss | 257/65 |
| 2005/0236668 | A1 | 10/2005 | Zhu et al. | 257/347 |
| 2005/0285187 | A1 | 12/2005 | Bryant et al. | 257/335 |
| 2007/0105297 | A1 * | 5/2007 | Jeong et al. | 438/197 |
| 2007/0128783 | A1 * | 6/2007 | Ting et al. | 438/199 |

\* cited by examiner

*Primary Examiner*—Hsien-ming Lee
(74) *Attorney, Agent, or Firm*—Williams, Morgan & Amerson, P.C.

(57) ABSTRACT

By forming a stressed semiconductor material in a gate electrode, a biaxial tensile strain may be induced in the channel region, thereby significantly increasing the charge carrier mobility. This concept may be advantageously combined with additional strain-inducing sources, such as embedded strained semiconductor materials in the drain and source regions, thereby providing the potential for enhancing transistor performance without contributing to process complexity.

8 Claims, 10 Drawing Sheets

TRANSISTOR HAVING A CHANNEL WITH BIAXIAL STRAIN INDUCED BY SILICON/GERMANIUM IN THE GATE ELECTRODE

BACKGROUND OF THE INVENTION

1. Field of the Invention

Generally, the present disclosure relates to the formation of integrated circuits, and, more particularly, to the formation of transistors having strained channel regions by using strain-inducing sources, such as an embedded strained layer in the drain and source regions to enhance charge carrier mobility in the channel region of a MOS transistor.

2. Description of the Related Art

The fabrication of integrated circuits requires the formation of a large number of transistor elements on a given chip area according to a specified circuit layout. Generally, a plurality of process technologies are currently practiced, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. Since the continuous size reduction of the critical dimensions, i.e., the gate length of the transistors, necessitates the adaptation and possibly the development of new, highly complex process techniques, for example, for compensating short channel effects, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling. Moreover, an increased carrier mobility may also compensate for other mechanisms required for reducing short channel effects, such as dopant increase in the channel region and the like.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility of electrons and holes, respectively. For example, for a typical transistor configuration, that is, a silicon crystal having a (100) surface orientation with the channel length aligned along the <110> orientation, uniaxial compressive strain along the channel length direction in the channel region may increase the mobility of holes, thereby providing the potential for enhancing the performance of P-type transistors. On the other hand, the creation of tensile strain in the channel region of an N-channel transistor may increase electron mobility. The introduction of stress or strain engineering into integrated circuit fabrication is an extremely promising approach for further device generations, since, for example, strained silicon may be considered as a "new" type of semi-conductor material, which may enable the fabrication of fast and powerful semiconductor devices without requiring expensive semiconductor materials, while many of the well-established manufacturing techniques may still be used.

Therefore, in some approaches, the hole mobility of PMOS transistors is enhanced by forming a strained silicon/germanium layer in the drain and source regions of the transistors, wherein the compressively strained drain and source regions create strain in the adjacent silicon channel region. To this end, respective sidewall spacers are formed at the gate electrode as required for the definition of the silicon/germanium regions, while the gate electrode is covered by a capping layer. Similarly, the NMOS transistors are completely covered by a capping layer. Then, the regions of the PMOS transistors exposed by the sidewall spacers are selectively recessed, while the gate electrode and the NMOS transistors are masked. Subsequently, a highly in situ doped silicon/germanium layer is selectively formed in the PMOS transistor by epitaxial growth techniques. Since the natural lattice spacing of silicon/germanium is greater than that of silicon, the epitaxially grown silicon/germanium layer, adopting the lattice spacing of the silicon, is grown under compressive strain, which is efficiently transferred to the channel region, thereby compressively straining the silicon therein substantially along the channel length direction. This integration scenario results in a significant performance gain of the P-channel transistors.

Since the further device scaling may involve further performance reducing mechanisms for countering short channel effects, such as increased dopant levels in the channel region, high-k dielectrics in the gate insulation layer and the like, it is, however, of great importance to provide efficient techniques for compensating for or over-compensating for such mobility degrading approaches by efficiently increasing the charge carrier mobility for P-channel and N-channel transistors by more efficiently using and/or combining strain-inducing mechanisms, such as strained silicon/germanium material, strained silicon/carbon material and the like.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to a technique for enhancing the strain in a channel region of a transistor element by providing a stressed material in the gate electrode in order to induce a biaxial strain in the channel region. Consequently, in addition to other strain-inducing sources, such as strained semiconductor materials in the drain and source regions, stress layers formed above the transistors and the like, a specific type of biaxial stress in the gate electrode may contribute to a significantly enhanced performance of respective transistor elements. For example, in silicon-based CMOS technologies, frequently a standard configuration may be used, in which the silicon-based semiconductor material has a surface orientation (100) while the length direction of the respective channel regions is frequently aligned along <110> orientation. In this case, a uniaxial tensile strain in the channel region along the channel length direction may significantly increase the electron mobility, while a compressive uniaxial strain may increase the hole mobility. On the other hand, a uniaxial strain in the channel width direction may also significantly affect the charge carrier mobility, wherein, for the above-described configuration, a tensile strain may increase the hole mobility as well as the electron mobility, thereby providing the potential for significantly enhancing the performance of one or both types of transistors in a CMOS device.

According to one illustrative embodiment disclosed herein, a semiconductor device comprises a substantially crystalline semiconductor region and a first gate electrode formed above the substantially crystalline semiconductor region so as to define a first channel region therein. The first channel region has a length direction and a width direction, wherein the first gate electrode has a biaxial tensile stress inducing a tensile biaxial strain in the first channel region along the channel length direction and the channel width direction.

According to another illustrative embodiment disclosed herein, a method comprises forming a first recess in a gate electrode of a first transistor and filling at least a portion of the first recess with a conductive material having a biaxial tensile stress in order to induce a biaxial tensile strain in a channel region of the first transistor.

According to yet another illustrative embodiment disclosed herein, a method comprises forming a first recess in a gate electrode and a second recess in drain and source regions of a first transistor in a common process. Moreover, a silicon/germanium material is formed in the first and second recesses by a selective epitaxial growth process.

BRIEF DESCRIPTION OF THE DRAWINGS

The disclosure may be understood by reference to the following description taken in conjunction with the accompanying drawings, in which like reference numerals identify like elements, and in which.

Figure 1A:
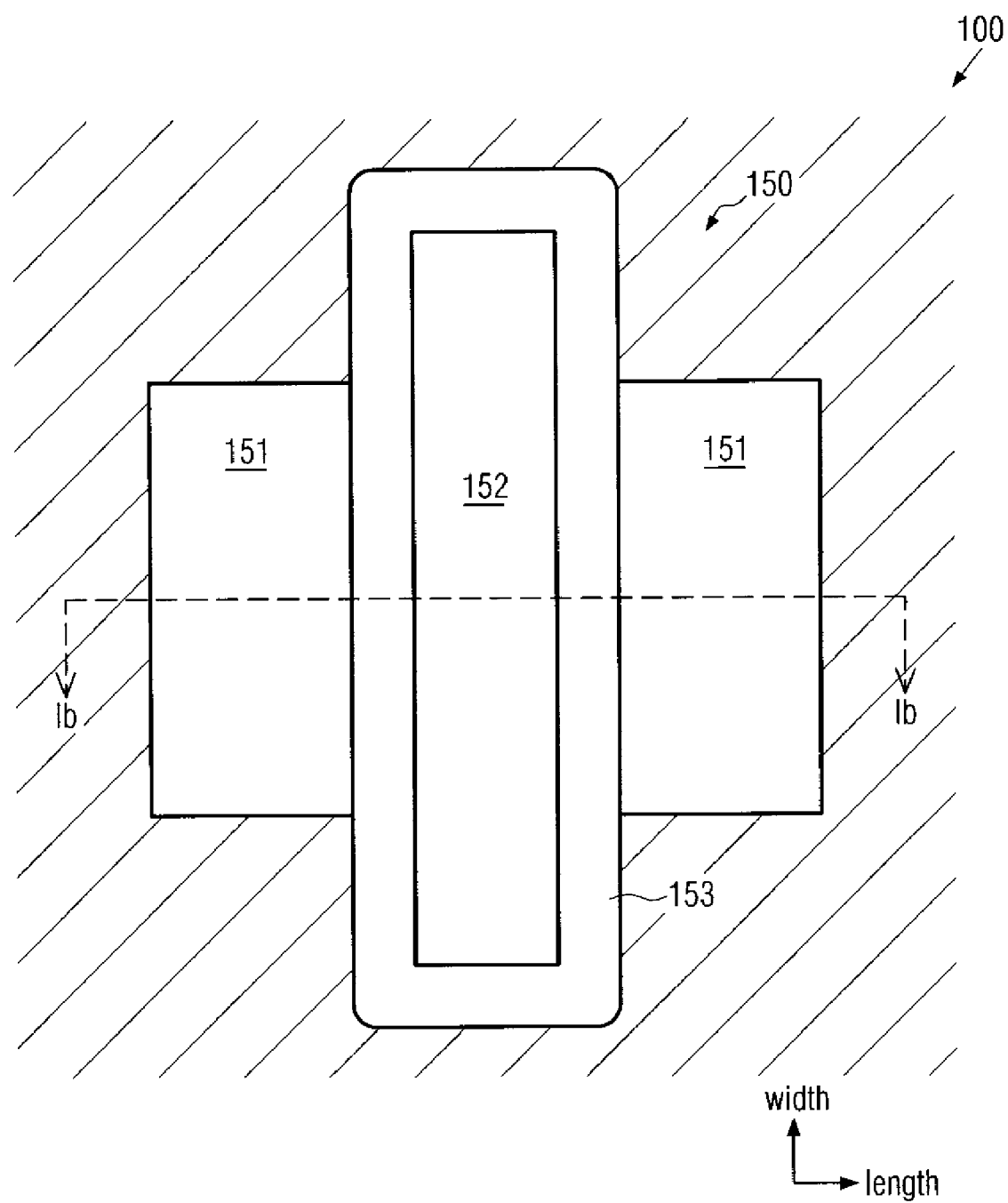
FIG. 1a schematically illustrates a top view of a transistor comprising a gate electrode that receives a material inducing biaxial tensile strain in accordance with illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for enhancing transistor performance by inducing an appropriate strain in respective channel regions of transistor elements. As previously explained, a plurality of process techniques are established in the art in order to create an appropriate strain, i.e., tensile or compressive strain for appropriately enhancing the respective charge carrier mobility. In some approaches, a substantially uniaxial strain is induced, for instance by incorporating an appropriately strained semiconductor material, such as silicon/germanium, in order to increase the hole mobility of P-channel transistors. Alternatively or additionally, the gate electrode may be used as a strain-inducing source, thereby providing biaxial strain in the underlying channel region which, if appropriately adapted to the corresponding crystallographic configurations of the channel region, may provide the desired increase of charge carrier mobility. A respectively stressed material may be formed in the gate electrode by first forming an appropriate recess therein and subsequently filling the recess with the stressed conductive material, which, in some illustrative embodiments, is provided in the form of a silicon/germanium material formed above a silicon-based material. It should be appreciated, however, that, depending on the base material of the gate electrode, other appropriate combinations of semiconductor mixtures and base semiconductor material may be used in order to obtain the desired type of biaxial stress in the respective gate electrode.

As previously explained, the required strain component in the channel length direction and the channel width direction may depend on the crystallographic characteristics of the crystalline material of the channel region and may be taken into consideration when selecting an appropriate material for obtaining the biaxial stress in the gate electrode. In one aspect, a standard crystallographic configuration of the basic crystalline semiconductor material may be used, in which a surface orientation (100) may be used, while transistors are typically formed such that the channel length direction is substantially aligned with the <110> orientation. In this case, a tensile strain component along the channel width direction may increase the charge carrier mobility of electrons and holes, while a tensile strain component along the channel length direction may increase the mobility of electrons, whereas a compressive strain component along the channel length direction may increase the hole mobility. Consequently, by using the gate electrode as a source of biaxial stress, a significant enhancement of performance may be obtained by appropriately combining the stressed gate electrode with one or more additional strain-inducing sources in the transistor element. It should be appreciated that replacing a portion of the gate electrode material by any appropriate stressed conductive material may be readily adapted to any specific crystalline configuration of the base material in order to obtain a desired gain in performance. Consequently, unless specifically pointed out in the description or in the appended claims, the present invention should not be considered as being restricted to a specific crystallographic orientation or specified semiconductor materials.

FIG. 1a schematically illustrates a top view of a semiconductor device 100 comprising a transistor 150, which may represent an N-channel transistor or a P-channel transistor. In the illustrative embodiment shown in FIG. 1a, the transistor 150 may represent a P-channel transistor, in which a strain-inducing mechanism provided by a strained semiconductor material to be formed in respective drain and source regions 151 may be combined with a stressed gate electrode 152. In this manufacturing stage, the gate electrode 152 may have formed on sidewalls thereof a sidewall spacer structure 153, which may be comprised of any appropriate dielectric material so as to reliably protect the sidewalls of the gate electrode 152 during subsequent process steps, as will be described in more detail later on. Furthermore, the drain and source regions 151 and the gate electrode 152 define a length direction which substantially corresponds to the horizontal direction in FIG. 1a, which may also be considered as a length direction of a channel region located below the gate electrode 152. Similarly, a width direction is defined perpendicular to the length direction.

Figure 1B:
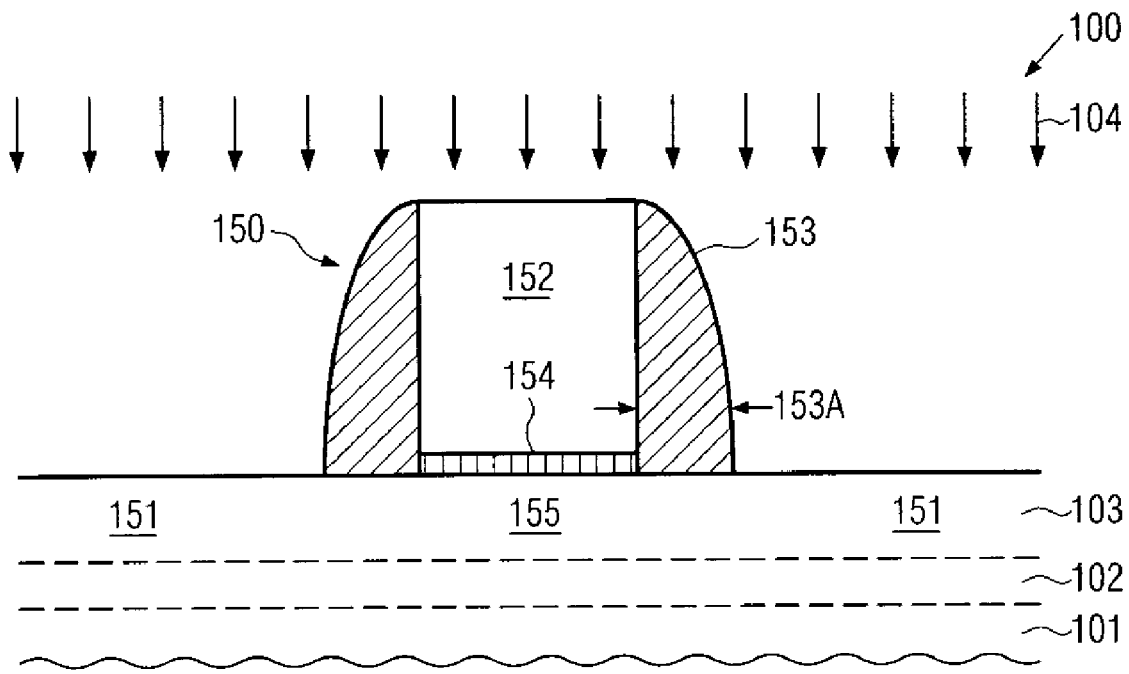
FIGS. 1b-1c schematically illustrate cross-sectional views of the transistor of FIG. 1a in further advanced manufacturing stages according to illustrative embodiments.

FIG. 1b schematically illustrates the semiconductor device 100 in a cross-sectional view. The device 100 may comprise a substrate 101, which may represent any appropriate carrier material for forming thereon an appropriate substantially crystalline semiconductor layer 103, such as a silicon-based material, or any other appropriate semiconductor material. For example, the semiconductor layer 103 may represent a silicon-based material, i.e., a crystalline semiconductor material including at least approximately 50 atomic percent silicon, while other components, such as germanium, carbon, any dopants and the like, may also be incorporated in the semiconductor layer 103. In other illustrative embodiments, a buried insulating layer 102, as indicated by the dashed line, may be provided, at least at specific areas of the substrate 101, in order to provide a silicon-on-insulator (SOI) like configuration. The buried insulating layer 102, if provided, may be formed of any appropriate material, such as silicon dioxide, silicon nitride and the like. A gate insulation layer 154 is formed on the semiconductor layer 103 so as to separate the gate electrode 152 from a respective channel region 155. It should be appreciated that, in the manufacturing stage shown in FIG. 1b, the drain and source regions 151 and the channel region 155 may have substantially the same configuration with respect to any dopants provided therein so that the drain and source regions 151 may represent areas in which an appropriate dopant profile has yet to be formed in order to obtain the required PN junctions with respect to the channel region 155. Consequently, the term "drain and source regions" as well as "channel region" is to be understood as describing the respective areas, in which the respective dopant profiles will be formed, irrespective of whether these dopants have already been introduced or are still to be incorporated in the respective areas.

The semiconductor device 100 as shown in FIGS. 1a and 1b may be formed on the basis of the following processes. After providing the substrate 101 having formed thereabove the semiconductor layer 103, respective isolation structures (not shown), for instance in the form of shallow trench isolations, may be manufactured on the basis of well-established techniques including lithography, etch, deposition and planarization techniques. On the basis of these respective isolation structures, the dimensions of the respective drain and source regions 151 may be defined within the semiconductor layer 103. Next, appropriate dopant profiles may be established within the semiconductor layer 103 for adjusting specific transistor characteristics, such as type of conductivity, threshold voltage and the like. Subsequently, the gate insulation layer 154 and the gate electrode 152 may be formed by forming a respective insulating material by oxidation and/or deposition followed by the deposition of an appropriate gate electrode material with a subsequent patterning process on the basis of advanced lithography and etch techniques. Next, the sidewall spacer structure 153 may be formed, for instance, by depositing an appropriate material, such as silicon nitride, silicon dioxide and the like, and patterning the material layer on the basis of well-established anisotropic etch techniques, wherein a width 153A of the spacer structure 153 may be used to adjust an offset of a strained semiconductor material to be formed in the drain and source regions 151 in subsequent process steps. In other process strategies, an appropriate ion implantation sequence may be performed prior to forming the spacer structure 153 in order to define respective extension regions in the drain and source regions 151 on the basis of appropriately designed offset spacers (not shown). After forming the spacer structure 153, which may reliably cover sidewalls of the gate electrode 152, a respective capping layer (not shown) may be formed above the transistor elements, such as N-channel transistors, if the transistor 150 is to represent a P-channel transistor, in order to protect the respective covered transistor elements from an etch process 104 designed to remove material from the gate electrode 152 selectively to the spacer structure 153. In the illustrative embodiment shown in FIG. 1b, the etch process 104 may also remove material from the drain and source regions 151. Other process strategies in which the gate electrode 152 is selectively recessed, substantially without removing material from the drain and source regions 151, will be described later on with reference to FIGS. 2a-2e. The etch process 104 may be designed as an isotropic etch process, a substantially anisotropic etch process or an etch process having any intermediate degree of isotropy, depending on the device requirements. For example, if a certain degree of under-etching of the spacer structure 153 is desired, the corresponding process parameters and process gases of the etch process 104 may be selected on the basis of well-established techniques to obtain an isotropic behavior. In still other illustrative embodiments, the etch process 104 may comprise, at least partially, a wet chemical etch step on the basis of appropriate chemicals. For instance, highly selective etch processes for silicon with respect to silicon nitride, silicon dioxide and the like are well-established in the art.

Figure 1C:
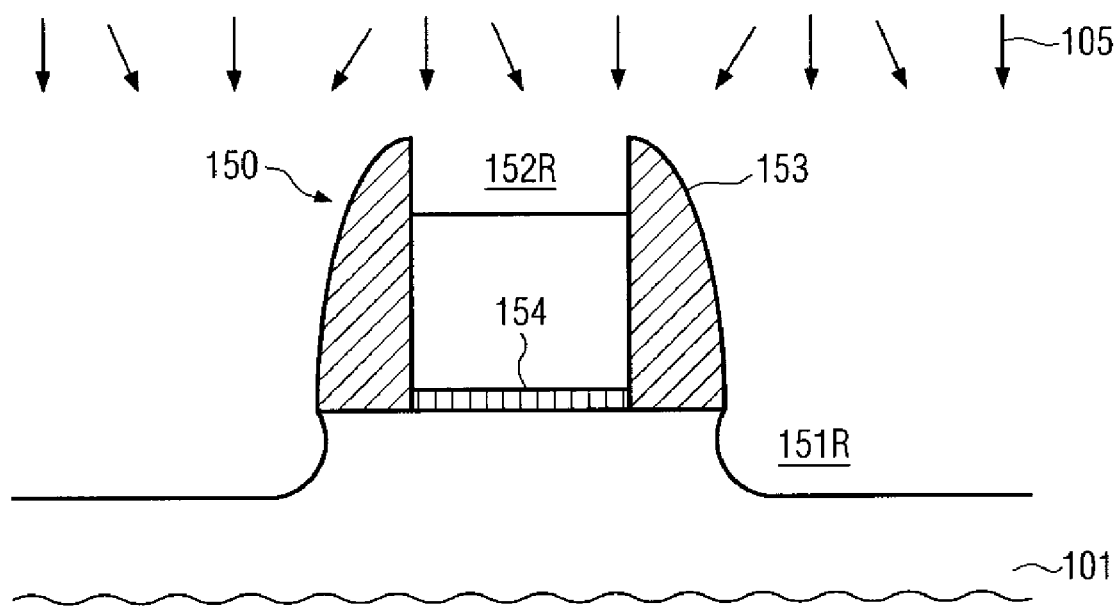

FIG. 1c schematically illustrates the semiconductor device 100 after the end of the etch process 104. Consequently, the transistor 150 comprises a first recess 152R defined in the gate electrode 152 and a second recess 151R formed in the drain and source regions 151. It may be appreciated that a respective depth of the first and second recesses 152R, 151R may differ due to a difference in crystallinity of the materials of the gate electrode 152 compared to the substantially crystalline material of the drain and source regions 151. For instance, polysilicon material of the gate electrode 152 may exhibit a slightly increased etch rate during the process 104 compared to the material of the drain and source regions 151. Thereafter, any cleaning processes may be performed in order to remove contaminants or any other residues from the preceding etch process so as to prepare the exposed surface portions of the gate electrode 152 and the drain and source regions 151 for a selective epitaxial growth process 105. During the epitaxial growth process 105, an appropriate semiconductor material may be deposited on exposed surface portions, wherein respective process parameters, such as temperature, pressure, precursor and carrier gases and the like, are appropriately selected so as to substantially restrict the adhesion of the semiconductor material to the exposed semiconductor surfaces, while a significant adhesion of material on the dielectric portions, such as the spacer structure 153 and any other capping layers, may be suppressed. When the drain and source regions 151 and the gate electrode 152 are substantially comprised of silicon, i.e., substantially crystalline silicon and polysilicon, respectively, a silicon/germanium mixture may be deposited during the epitaxial growth process 105 in order to form a respectively strained semiconductor material in the recess 151R, while the silicon/germanium material in the recess 152R, formed on the polysilicon material, may result in tensile-stressed material transferring its tensile stress to the underlying polysilicon material. In some illustrative embodiments, additionally, the silicon/germanium material may be deposited as a highly doped material, thereby providing the required dopant concentration in the drain and source regions 151 after refilling the recess 151R. In other illustrative embodiments, the silicon/germanium material may be deposited as a substantially intrinsic material, i.e., non-doped material, thereby enhancing the controllability of the respective growth process 105, and the required dopant concentration in the drain and source regions 151 as well as in the gate electrode 152 may be established in a later manufacturing stage on the basis of implantation techniques.

Figure 1D:
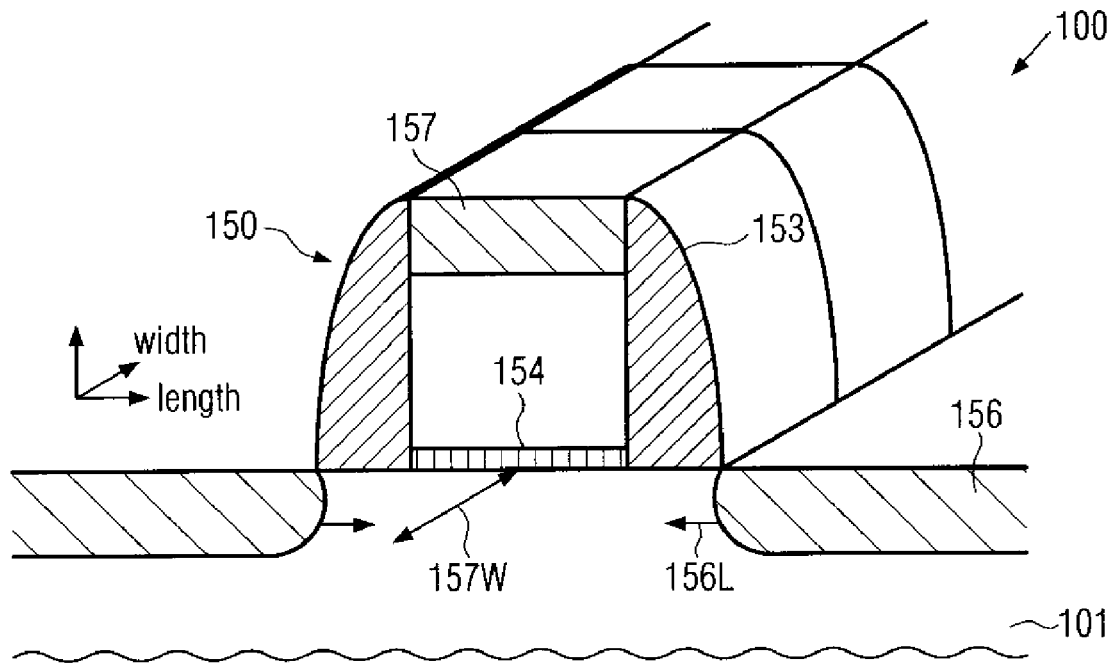
FIG. 1d schematically illustrates a perspective view of the transistor including the biaxially stressed gate electrode and an additional strain-inducing source according to illustrative embodiments disclosed herein.

FIG. 1d schematically illustrates a perspective view of the semiconductor device 100 after the completion of the epitaxial growth process 105. Hence, the transistor 150 comprises a strained semiconductor material 156 in the drain and source regions 151, wherein the strained semiconductor material 156 provides a substantially uniaxial compressive strain with respect to the lateral dimensions, i.e., the channel length and width directions, which is oriented in the channel length direction, indicated as 156L, since both regions 151 "act" on the channel region 155 in the length direction "across" the channel region 155 in a superposing manner. In the width direction and the depth direction, a significantly reduced effect may be obtained, since the strained material 156 only acts in "tangential" manner. Moreover, a stressed silicon/germanium material 157 is formed above the polysilicon material of the gate electrode 152 and induces a respective biaxial strain in the channel region 155, so that a strain component, indicated as 157W, in the transistor width direction is obtained. A corresponding strain component along the length direction (not shown), induced by the stressed material 157, may also be present, which may, however, be efficiently overcompensated for by the corresponding uniaxial strain 156L. Thus, for the standard transistor configuration in which the length direction is oriented along the <110> orientation, a significant increase of transistor performance of the P-channel transistor 150 may be obtained, since both strain components 156L, 157W result in a respective increase of the hole mobility.

Figure 1E:
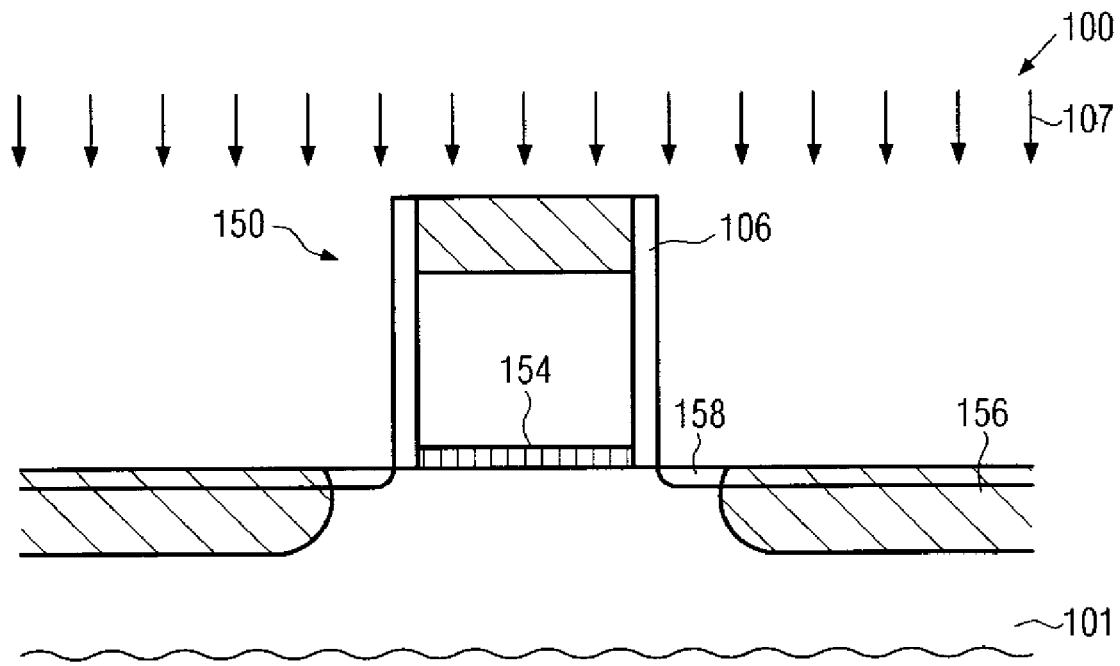
FIGS. 1e-1f schematically illustrate cross-sectional views of the transistor of FIG. 1d in further advanced manufacturing stages.

FIG. 1e schematically illustrates the semiconductor device 100 in a further advanced manufacturing stage. In this process strategy, the spacer structure 153 may be removed, for instance on the basis of well-established highly selective etch recipes, for instance commonly with any capping layer covering other transistors, such as N-channel transistors during the preceding manufacturing processes, and subsequently an appropriate offset spacer structure 106 may be formed on the basis of well-established spacer techniques. Based on the offset spacer 106, a further implantation process 107 may be performed in order to define respective extension regions 158 in the drain and source regions 151. It should be appreciated that in other embodiments the offset spacer structure 106 may have been formed prior to forming the respective semiconductor materials 156 and 157 in order to reduce any implantation-induced damage in the epitaxially grown materials 157 and 156. After the formation of the extension regions 158, depending on whether or not the materials 156 and 157 have been provided as highly doped semiconductor material, further implantation processes may be performed in order to define the dopant profile in the drain and source regions 151 in accordance with device requirements. Moreover, an appropriately designed anneal process may be performed so as to activate dopants introduced by implantation and also to recrystallize implantation-induced lattice damage.

Figure 1F:
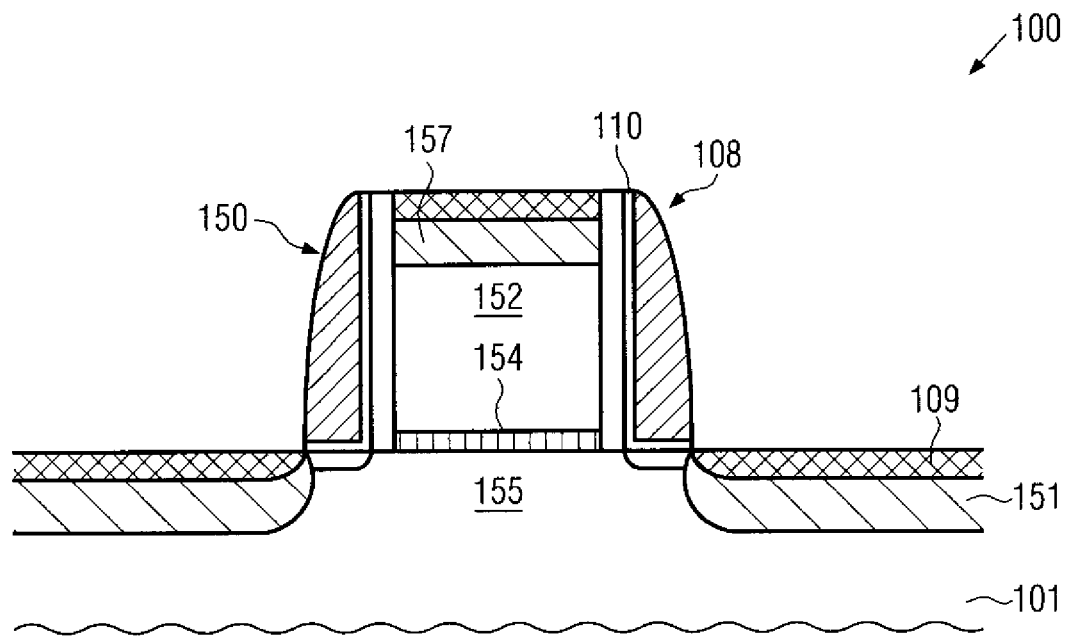

FIG. 1f schematically illustrates the semiconductor device 100 in a further advanced manufacturing stage. A further sidewall spacer structure 108 may be formed adjacent to the gate electrode 152, wherein, as previously explained, the sidewall spacer structure 108 may be used for a further implantation sequence when the dopant profile in the drain and source regions 151 is to be adjusted on the basis of an implantation process. In other embodiments, the spacer structure 108 may be formed with respect to spacer width in view of requirements with respect to metal silicide regions 109 formed in the drain and source regions 151 and in the gate electrode 152. The spacer structure 108 may be formed on the basis of well-established techniques including the deposition of a liner material 110 and forming thereon an appropriate dielectric material, such as silicon nitride, which is then patterned by anisotropic techniques to provide the spacer structure 108. Thereafter, any appropriate silicidation process may be performed in order to provide the regions 109, wherein an offset thereof from the channel region 155 is substantially determined by the width of the spacer structure 108. An appropriate interlayer dielectric material may be formed above the transistor 150, wherein, in some cases, the dielectric material may include a stressed layer for further enhancing the strain in the channel region 155, as will also be described in more detail later on.

As a result, the transistor 150 comprises the gate electrode 152 having a biaxial tensile stress that induces a respective strain in the channel region 155, thereby increasing charge carrier mobility of holes in P-channel transistors, in particular if combined with an additional strain-inducing source, such as the strained semiconductor material 156 in the drain and source regions 151. In this case, the overall performance of the transistor 150 may be significantly enhanced compared to conventional devices including, for instance, a strained silicon/germanium material as a strain-inducing source, while a high degree of compatibility with conventional manufacturing processes is achieved. Furthermore, the additional gain in performance may be accomplished without additional process complexity, since additional process steps compared to a process flow for forming the strained semiconductor material 156 may not be necessary. It should be appreciated, however, that the gate electrode 152 having the biaxial tensile stress may also be advantageously used in N-channel transistors, possibly in combination with other strain-inducing mechanisms, since, in the N-channel transistor, the tensile strain along the transistor width direction and the length direction may both increase the electron mobility, thereby representing an efficient strain-inducing source.

With reference to FIGS. 2a-2e, further illustrative embodiments will now be described in more detail, in which a biaxially stressed gate electrode may be formed in one or more transistor types without forming respective recesses in the drain and source regions so that the strain-inducing mechanism provided by the stressed gate electrode may or may not be combined with other strain-inducing sources without requiring the selective epitaxial growth in the drain and source regions.

Figure 2A:
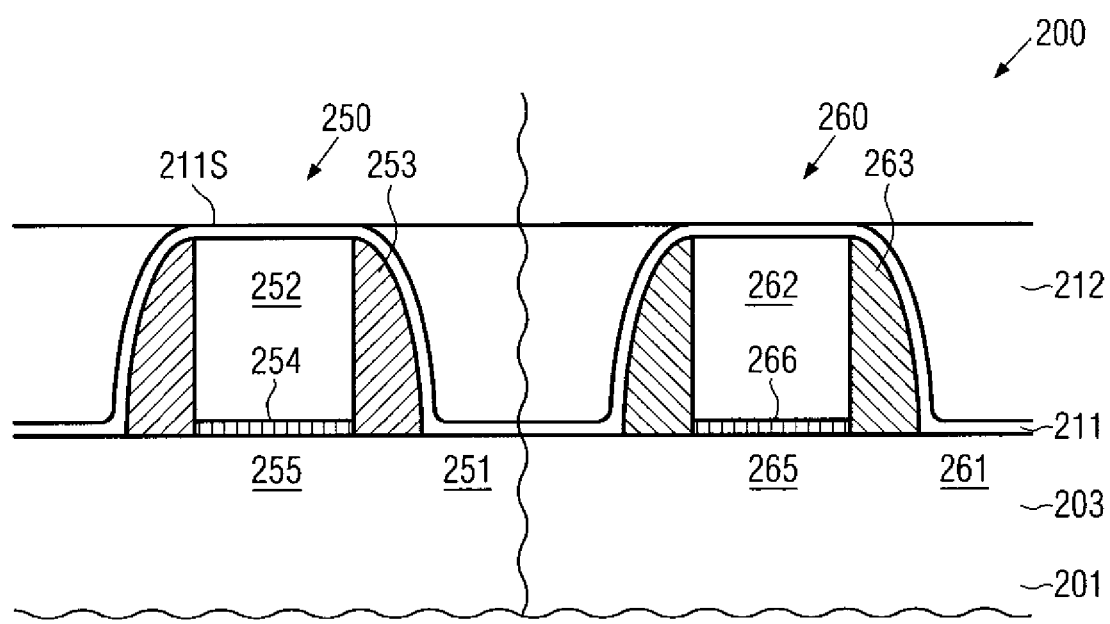
FIGS. 2a-2e schematically illustrate cross-sectional views of a semiconductor device including different types of transistors, which receive a biaxially stressed gate electrode in combination with a stress layer according to illustrative embodiments disclosed herein.

FIG. 2a schematically illustrates a cross-sectional view of a semiconductor device 200 comprising a first transistor 250 and a second transistor 260. The first and second transistors 250 and 260 may be formed in and on respective portions of a semiconductor layer 203, which in turn is formed above a substrate 201. With respect to the substrate 201 and the semiconductor layer 203, the same criteria apply as explained with the components 101 and 103. Furthermore, it should be appreciated that one or both of the transistors 250, 260 may represent SOI-like transistors, wherein respective buried insulating layers (not shown) may be provided, as is also previously explained with reference to the device 100. Furthermore, the transistors 250, 260 may comprise respective gate electrodes 252, 262, formed on respective gate insulation layers 254, 264. Furthermore, respective spacers 253, 263 may be formed on the corresponding sidewalls of the gate electrodes 252, 262. Similarly, respective drain and source regions 251, 261 enclosing corresponding channel regions 255, 265 may be provided. It should be appreciated that the transistors 250, 260 may represent transistors of the same conductivity type, however having a different configuration with respect to one or more design requirements, such as thickness of the respective gate insulation layers 254, 264, gate length, transistor width and the like. In other illustrative embodiments the transistors 250, 260 may represent transistors of a different conductivity type. For instance, the transistor 250 may represent a P-channel transistor, while the transistor 260 may represent an N-channel transistor. In this case, the respective drain and source regions 251, 261 and the channel regions 255, 265 may have formed therein or may receive a different type of dopant according to well-established CMOS regimes. Regarding the various components of the transistors 250, 260 described so far, the same criteria apply as previously explained with reference to the semiconductor device 100. Moreover, the device 200 may comprise a mask layer 211, formed above the first and second transistors 250, 260, wherein the layer 211 may be formed of any appropriate material such as silicon dioxide, silicon nitride and the like. Furthermore, a fill layer 212, which may be comprised of any appropriate material, such as resist material, polymer material and the like, may be formed in the device 200 to provide a substantially planar surface topography for the device 200.

The semiconductor device 200 as shown in FIG. 2a may be formed on the basis of the following processes. The transistors 250, 260 may be formed by process techniques as previously described with reference to the transistor 150, wherein it should be appreciated, however, that different implantation techniques and the like may be used so as to take into consideration any differences with respect to the conductivity type when an N-channel transistor and a P-channel transistor are considered. Corresponding differences in providing the appropriate dopant within the channel regions 255, 265 are well-established in the art. Consequently, after the formation of the gate electrodes 252, 262 and the spacer structures 253, 263, the mask layer 211 may be formed by any appropriate deposition technique, such as plasma enhanced chemical vapor deposition (CVD), thermal CVD, oxidation, when the mask layer 211 is provided in the form of an oxide material, and the like. Thereafter, the fill layer 212 may be formed by a highly non-conformal deposition technique, such as spin-on techniques, CVD techniques based on appropriately selected process parameters and the like. In some illustrative embodiments, the fill layer 212 may be provided as a resist material or polymer material that may be deposited in a low-viscous state by spin-on techniques. If required, a further planarization step may be performed, for instance by chemical mechanical polishing, thereby also exposing a surface portion 211S of the mask layer 211. In other cases, a corresponding removal of any excess material of the fill layer 212 may be performed by an appropriately designed etch process. In some illustrative embodiments, the removal of any excess material of the layer 212 may be continued so as to also expose the corresponding gate electrodes 252 and 262, which may be accomplished on the basis of CMP, etching and the like. In still other illustrative embodiments, after exposing the surface portions 211S, an appropriately designed etch process may be performed so as to selectively etch material of the mask layer 211 with respect to the underlying gate electrode 252, 262.

Figure 2B:
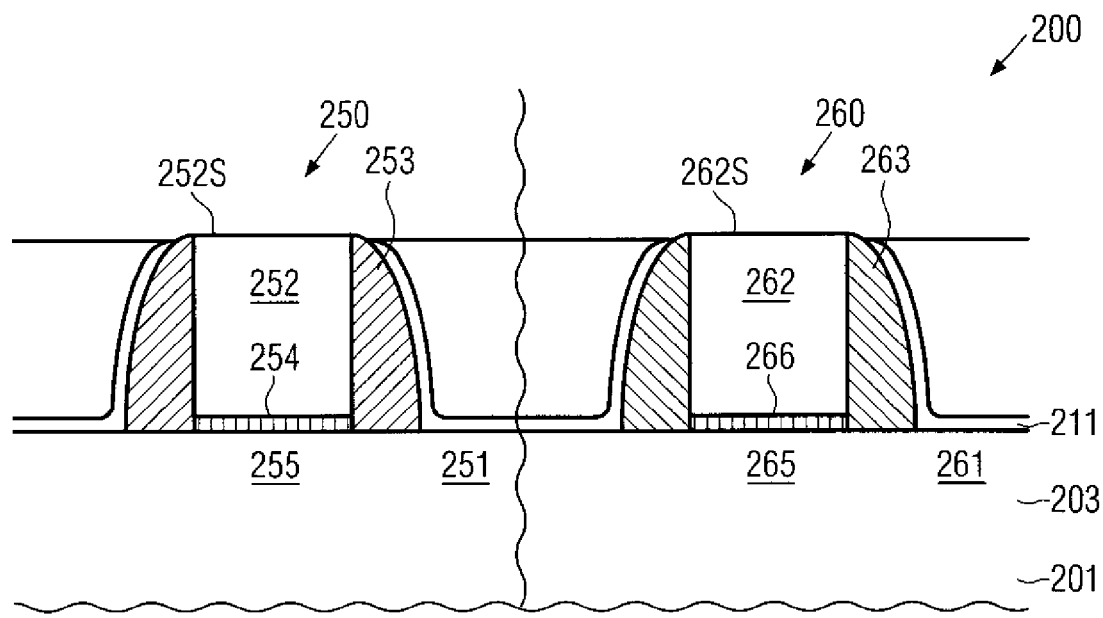

FIG. 2b schematically illustrates the semiconductor device 200 after the above-described process sequence. Hence, respective surface portions 252S, 262S of the gate electrodes 252, 262 are exposed.

Figure 2C:
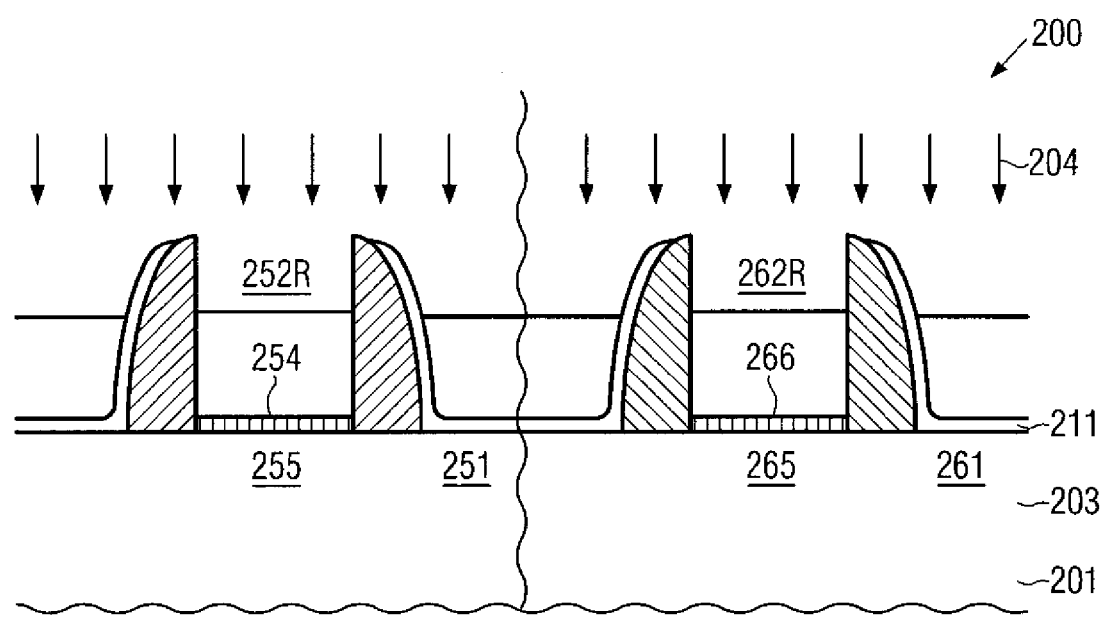

FIG. 2c schematically illustrates the semiconductor device 200 during an etch process 204. The etch process 204 may be designed as any appropriate isotropic or anisotropic etch process for removing material from the respective gate electrodes 252, 262 selectively to the corresponding spacers 253, 263, wherein a pronounced selectivity with respect to the material of the fill layer 212 may not be necessary. In still other illustrative embodiments, the fill material 212 may be removed prior to the etch process 204, when the etch process 204 is also highly selective with respect to the mask layer 211. Consequently, respective recesses 252R, 262R are formed in the gate electrodes 252, 262. It should be appreciated that the dimensions of the recesses 252R, 262R, i.e., a depth thereof, may be selected in conformity with requirements regarding the amount of stressed semiconductor material for the gate electrodes 252, 262, while other device requirements, such as a depth of a recess in the respective drain and source regions, as is for instance described with reference to the device 150, may not be relevant. Next, further etch and/or cleaning processes may be performed to remove material residues of the fill layer 212 and other contaminants resulting from the preceding etch process 204, thereby also preparing the exposed surface of the device 200 for a subsequent epitaxial growth process.

Figure 2D:
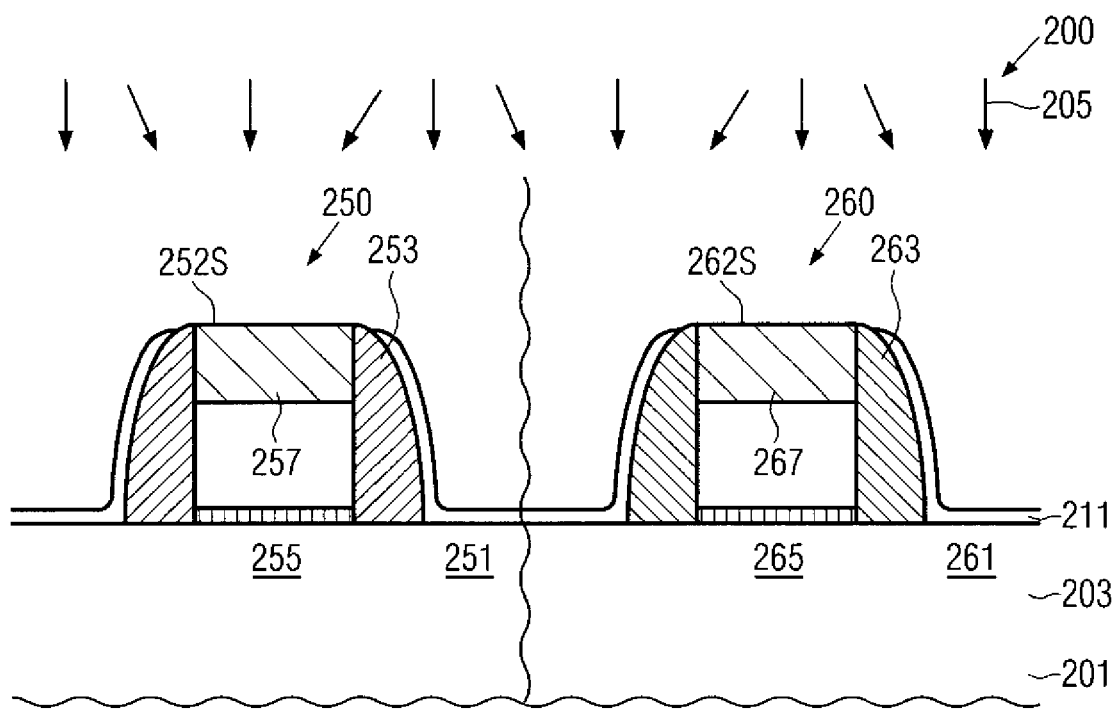

FIG. 2d schematically illustrates the semiconductor device 200 during a selective epitaxial growth process 205, which, in one illustrative embodiment, may be designed so as to deposit silicon/germanium material on the polysilicon material of the gate electrodes 252, 262. It should be appreciated, however, that any other appropriate semiconductor materials may be deposited during the process 205 so as to obtain the biaxially stressed materials 257, 267, depending on the configuration of the underlying gate electrode materials. During the selective epitaxial growth process 205, the mask layer may reliably suppress a deposition of semiconductor material above the respective drain and source regions 251, 261. To this end, any appropriate dielectric material may be selected, such as silicon dioxide, silicon nitride and the like, for which highly efficient selective epitaxial growth techniques are established. After the process 205, the mask layer 211 and the spacers 253, 263 may be removed on the basis of well-established selective etch processes, wherein a single etch recipe may be used when the mask layer 211 and the spacers 253, 263 are comprised of substantially the same material. In other cases, in a first etch step, the mask layer 211 may be selectively removed wherein established etch recipes may be used when the mask layer 211 is comprised of silicon dioxide. In a subsequent etch step, the spacers 253, 263 may then be removed, as is previously described. Thereafter, the further processing may be continued on the basis of well-established CMOS techniques.

Figure 2E:
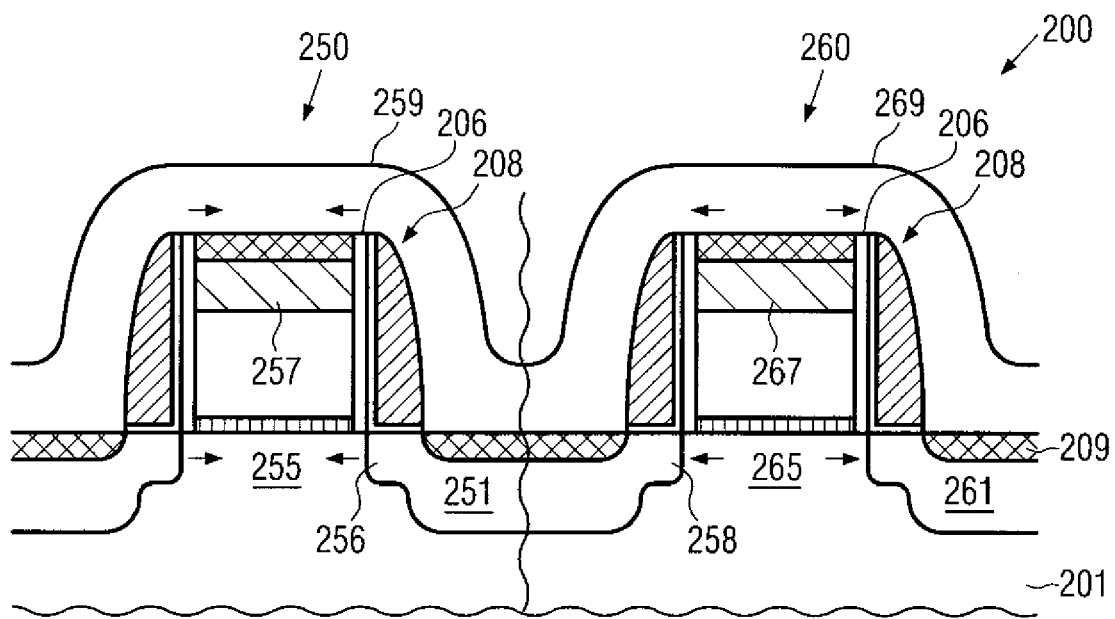

FIG. 2e schematically illustrates the semiconductor device 200 in a further advanced manufacturing stage. The transistors 250, 260 may comprise respective spacers 206 and 208, which may have been used for creating the desired dopant profile in the respective drain and source regions 251, 261, thereby also forming respective extension regions 258, 268. Moreover, respective metal silicide regions 209 may be formed in the transistors 250, 260 as is also previously described with reference to the transistor 150. Furthermore, the transistor 250 may comprise a dielectric stress layer 259 having an appropriate intrinsic stress in order to induce a respective strain in the channel region 255. For example, the stress layer 259 may comprise a high intrinsic compressive stress when the transistor 250 represents a P-channel transistor, thereby generating a respective compressive strain component in the transistor length direction, thereby significantly increasing the hole mobility. At the same time, the stressed semiconductor material 257 in the gate electrode 252 provides an increased strain component in the transistor width direction, as is also previously described, thereby even further enhancing the hole mobility in the channel region 255. Similarly, the transistor 260 may comprise a stress layer 269 having an appropriately selected intrinsic stress, which may be a high tensile stress, when the transistor 260 represents an N-channel transistor. In this case, a respective tensile strain component may be induced along the channel length direction in the channel region 265, while additionally the stressed semiconductor material 267 may provide a respective tensile strain component in the transistor width direction, which may also increase the electron mobility for a standard transistor configuration, as is previously explained, since the tensile strain components in the transistor width direction may simultaneously increase electron mobility and hole mobility.

The respective stress layers 259, 269 may be formed in accordance with well-established techniques. For instance, silicon nitride may be deposited by plasma enhanced CVD on the basis of appropriately selected process parameters, such as ion bombardment during deposition, pressure, temperature and the like, so as to adjust the desired type and magnitude of the intrinsic stress. Thus, after the deposition of one of the layers 259, a respective portion thereof may be removed from the other transistor type and an appropriately stressed layer may be subsequently deposited. It should be appreciated that the stress layers 259, 269 may include one or more intermediate layers, which may be used for forming the different type of stress layers 259, 269.

As a consequence, the provision of the stressed semiconductor material 257, 267 in the transistors 250, 260 enables the enhancement of transistor performance of the same or different transistor types without requiring the formation of strained semiconductor material in the respective drain and source regions.

With reference to FIGS. 3a-3d and 4a-4d, further illustrative embodiments will now be described in more detail, in which a stressed gate electrode in different transistor types is efficiently combined with the formation of strained semiconductor material in at least one of the different transistor types.

Figure 3A:
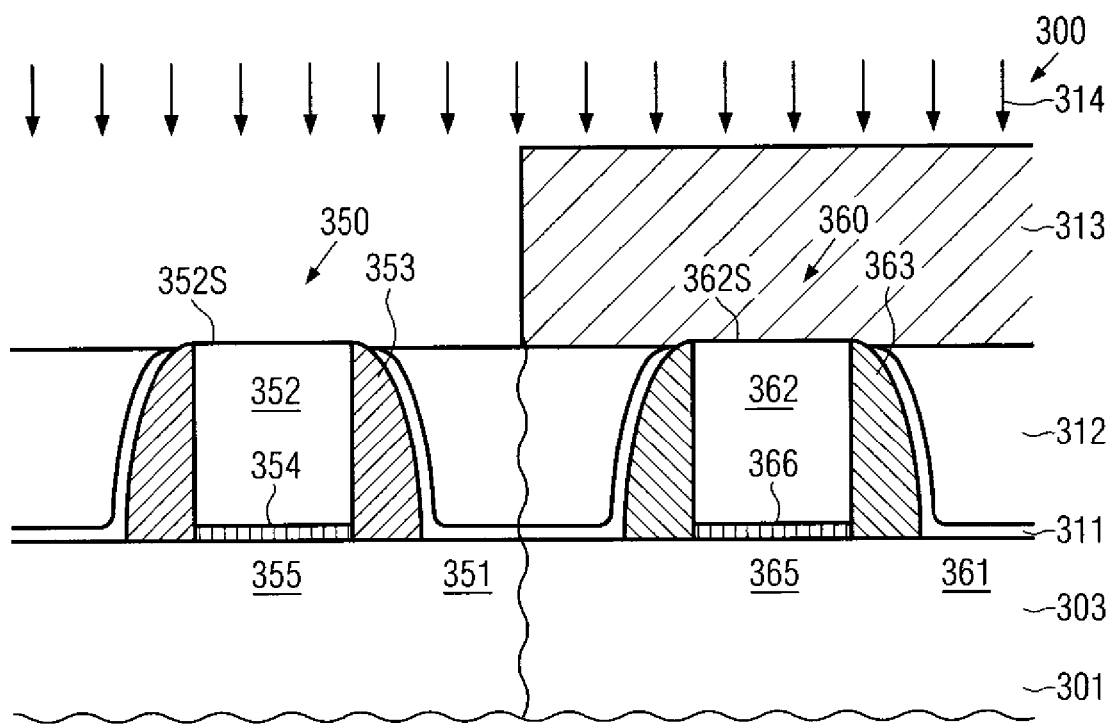
FIGS. 3a-3d schematically illustrate cross-sectional views of a semiconductor device including two transistors, one of which may receive, in addition to the biaxially stressed gate electrode, a strained semiconductor material selectively to the other transistor in accordance with illustrative embodiments.

FIG. 3a schematically illustrates a semiconductor device 300 that may have a similar configuration as the semiconductor device 200 as shown in FIG. 2b. Consequently, transistors 350, 360 may comprise respective gate electrodes 352, 362 formed above respective gate insulation layers 354, 364. Furthermore, respective spacers 353, 363 may be formed on sidewalls of the gate electrodes 352, 362. Furthermore, a mask layer 311 may be formed above the transistors 350, 360 while a fill layer 312 may be formed to provide a substantially planar surface configuration. Furthermore, in this manufacturing stage, respective surface portions 352S, 362S of the gate electrodes 352, 362 may be exposed.

The transistors 350, 360 described so far may be formed on the basis of processes as are previously described with reference to FIGS. 2a and 2b when describing the semiconductor device 200. Moreover, after the exposure of the respective surface portions 352S, 362S, a respective etch mask 313, for instance comprised of photoresist and the like, may be formed to expose the transistor 350 while covering the transistor 360. Moreover, the device 300 may be subjected to an etch process 314, during which the exposed portion of the fill layer 312 and the mask layer 311 may be selectively removed with respect to the materials of the gate electrode 352 and the spacers 353. For instance, the fill material 312 may be comprised of any appropriate polymer material, resist material and the like which may be removed on the basis of appropriately selected etch recipes. After exposure of the mask layer 311, the etch process 314 may be configured to selectively remove the layer 311. For example, highly selective etch recipes for silicon dioxide in the presence of silicon and silicon nitride are well-established in the art. Thereafter, the etch mask 313 may be removed, for instance by oxygen-based plasma treatments and the like.

Figure 3B:
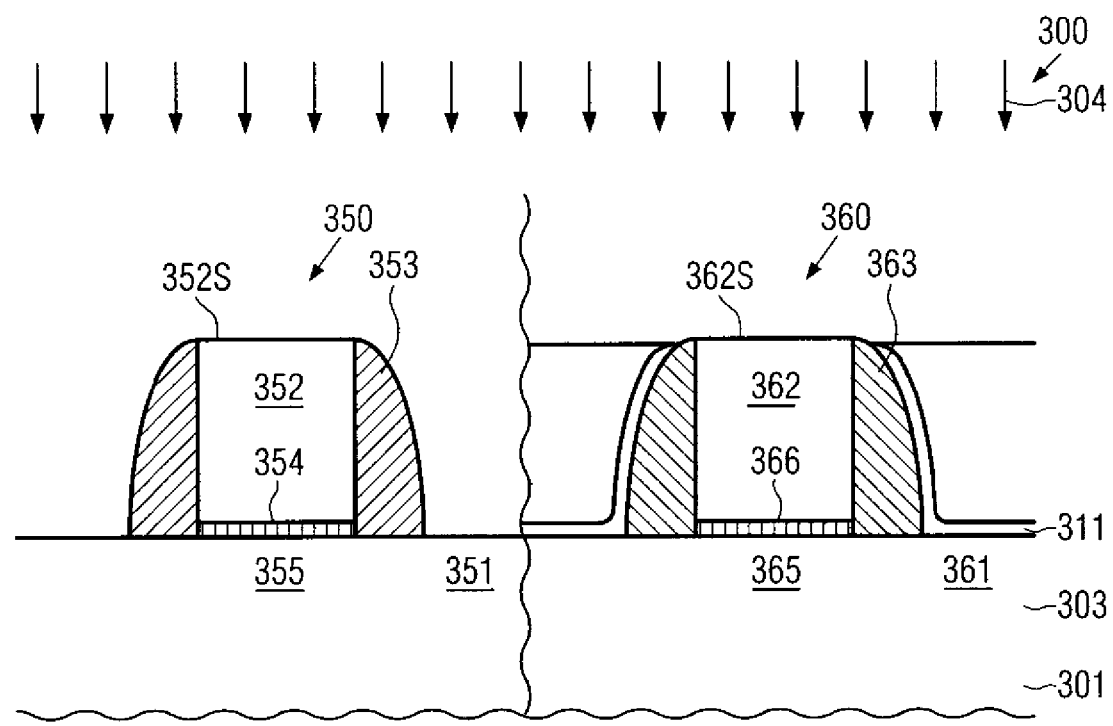

FIG. 3b schematically illustrates the semiconductor device 300 after the completion of the above-described process sequence and during an etch process 304 assigned to selectively remove material from the gate electrodes 352, 362 and from drain and source regions 351 of the transistor 350. During the etch process 304, respective drain and source regions 361 of the transistor 360 may be reliably covered by the fill layer 312 and the mask layer 311.

Figure 3C:
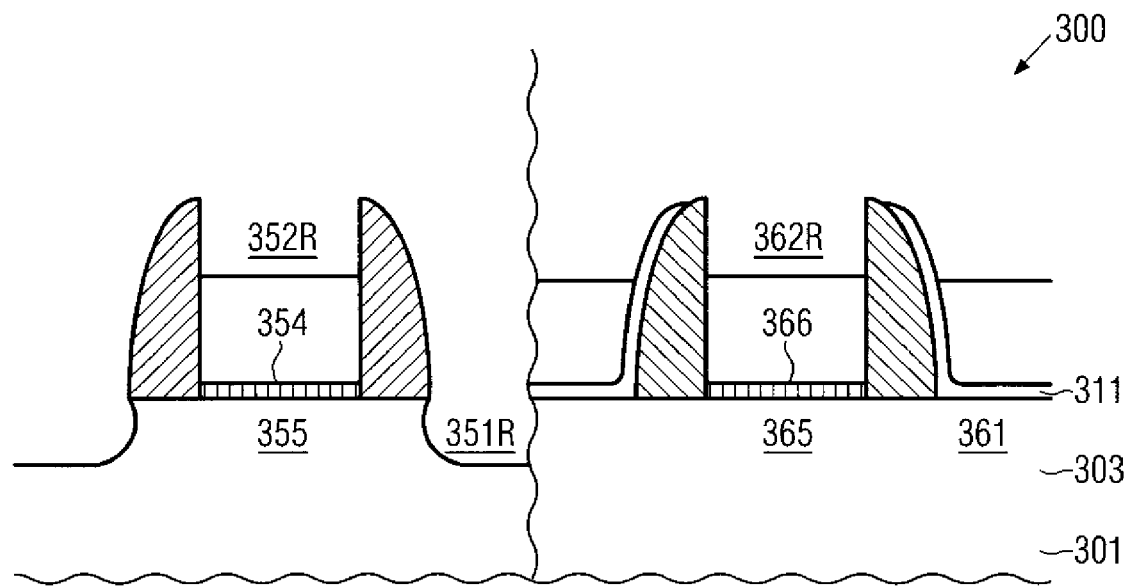

FIG. 3c schematically illustrates the semiconductor device 300 after the end of the etch process 304. Hence, a recess 352R and a recess 351R are formed in the gate electrode 352 and the drain and source regions 351 of the transistor 350, whereas a recess 362R is formed in the gate electrode 362 of the transistor 360. Next, any residues of the fill material 312 may be removed along with other residues, thereby preparing the device 300 for a subsequent epitaxial growth process.

Figure 3D:
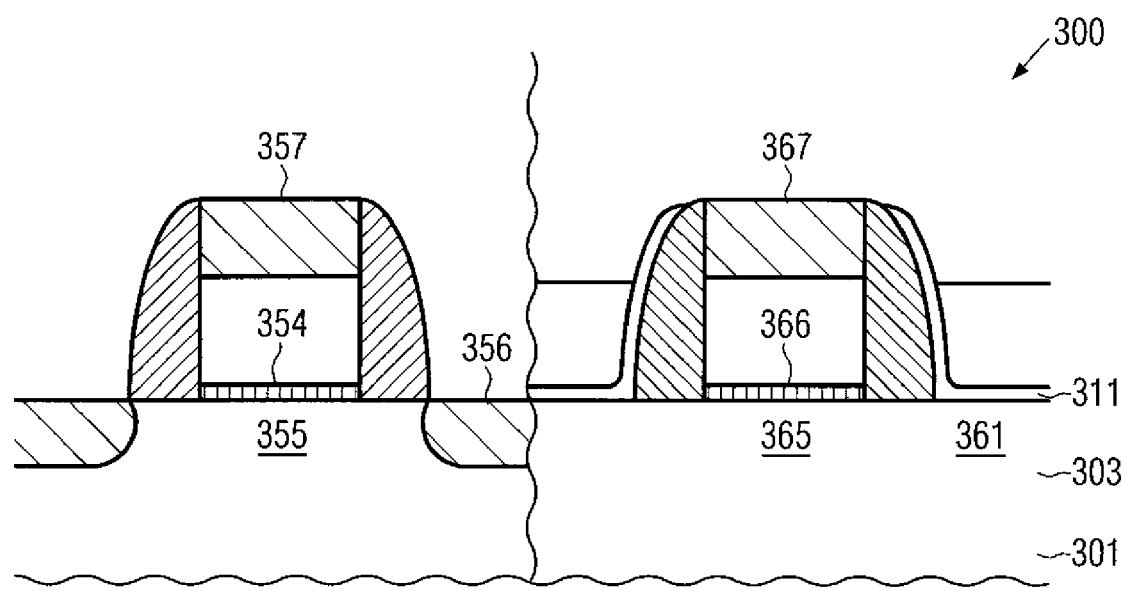

FIG. 3d schematically illustrates the semiconductor device 300 with respective stressed semiconductor materials 357 and 367 in the respective gate electrodes 352, 362 while a corresponding strained semiconductor material 356, such as silicon/germanium, may be formed in the drain and source regions 351 of the transistor 350. Consequently, a biaxial strain comprising a tensile component in the transistor width direction and a compressive component in the transistor length direction may be provided in the transistor 350, thereby significantly enhancing the hole mobility therein, while a biaxial tensile strain may be created in the transistor 360, thereby improving the electron mobility. The further processing may be continued on the basis of any process strategies as described above, wherein, depending on the requirements, additional dielectric stress layers, such as the layers 259 and 269, may be appropriately provided for the semiconductor device 300.

Figure 4A:
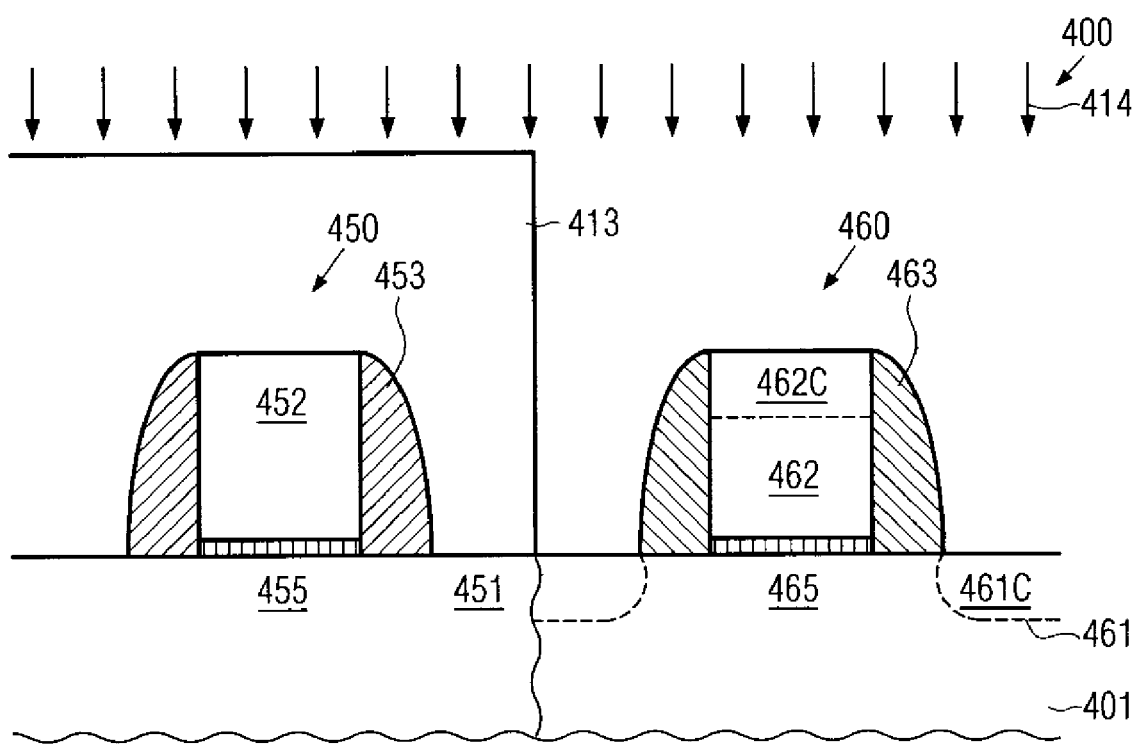
FIGS. 4a-4d schematically illustrate cross-sectional views of a semiconductor device including two transistor elements receiving biaxially stressed gate electrodes and different types of strained semiconductor material in the respective drain and source regions according to yet other illustrative embodiments disclosed herein.

FIG. 4a schematically illustrates a semiconductor device 400 comprising a first transistor 450 and a second transistor 460 comprising respective gate electrodes 452, 462 on sidewalls of which are formed respective spacers 453, 463. With respect to these components, as well as other components such as drain and source regions, gate insulation layers and the like, the same criteria apply as previously explained with reference to the devices 100, 200 and 300. Moreover, an implantation mask 413 may be formed to cover the transistor 450 while exposing the transistor 460. The implantation mask 413 may be comprised of any appropriate material, such as photoresist and the like. Furthermore, the device 400 may be subjected to a process sequence 414 for introducing carbon material into drain and source regions 461 of the transistor 460. In one illustrative embodiment, the process sequence 414 may comprise an amorphization implantation, for instance on the basis of silicon, in order to provide a substantially amorphized portion within the drain and source regions 461. Thereafter, the sequence 414 may include an appropriately configured implantation process to introduce a desired concentration of carbon atoms into the previously amorphized portion, wherein, for instance, an implantation dose of approximately $5 \times 10^{15}$ to $5 \times 10^{16}$ ions/cm$^2$ may be appropriate for incorporating a concentration of approximately 1.5-4.0 atomic percent carbon. Consequently, respective carbon-containing regions 461C may be formed within the drain and source regions 461, wherein it should be appreciated that a respective carbon containing region 462C may also be created in the gate electrode 462.

Figure 4B:
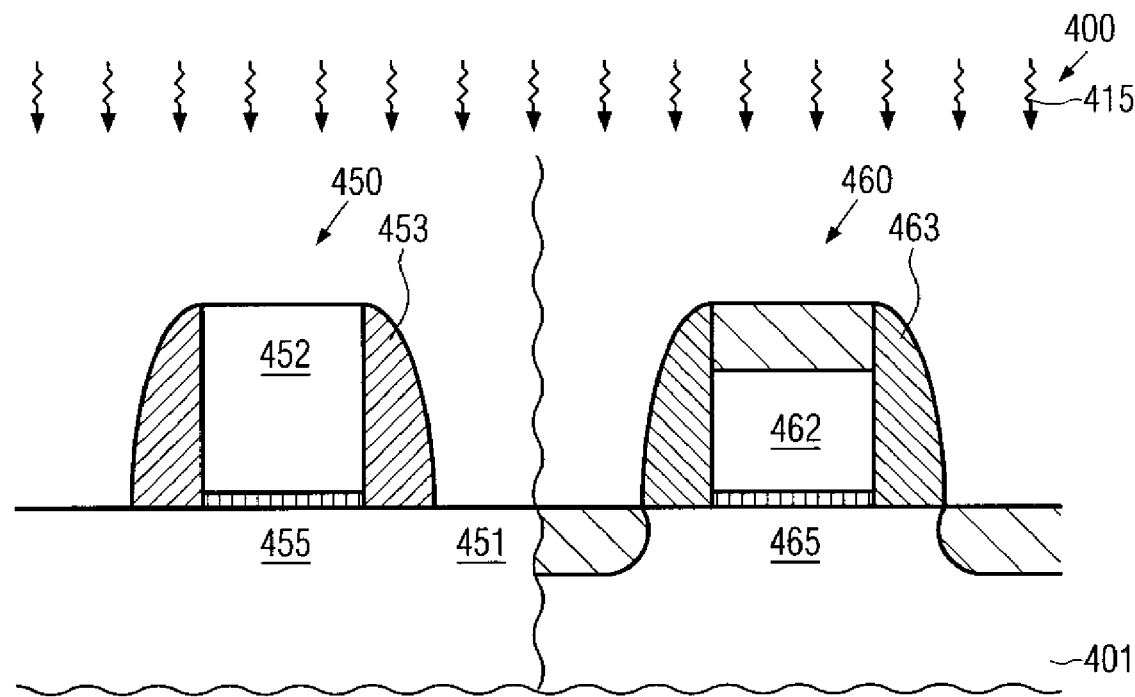

FIG. 4b schematically illustrates the semiconductor device 400 after removal of the implantation mask 413 and during an advanced anneal process 415, which may comprise laser-based or flash-based anneal methods. During the flash-based or laser-based anneal process, a restricted portion of the device 400 or the entire device 400 is exposed to radiation for an extremely short time period, in which sufficient energy may be deposited so as to initiate the re-crystallization and activation of carbon atoms, while substantially suppressing or avoiding the out-diffusion of dopant species incorporated in the device area under consideration. Consequently, the carbon-containing regions 461C, 462C may be efficiently converted into crystalline and polycrystalline areas, respectively, while any dopant profiles, previously established within the semiconductor device 400, may be substantially maintained. Thereafter, the further processing may be continued as is for instance described with reference to the device 300, in which respective recesses are commonly formed in the gate electrodes and in one of the transistors of the device 300.

Figure 4C:
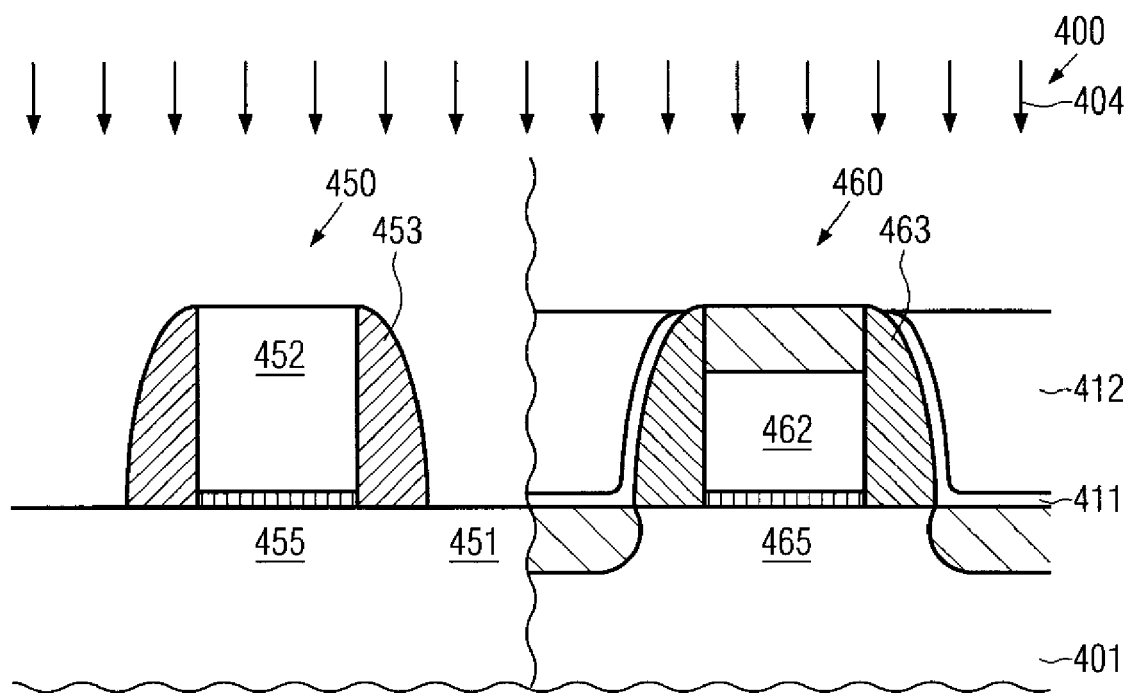

FIG. 4c schematically illustrates the semiconductor device 400 wherein the transistor 450 is exposed to an etch process 404, while the second transistor 460 may only be exposed with its gate electrode 462, i.e., the carbon-containing region 462C. For this purpose, a respective mask layer 411, for instance comprised of silicon dioxide and the like, and a fill layer 412 may be selectively formed in the second transistor 460 in order to reliably cover the carbon-containing regions 461C in the drain and source regions 461, as is described above for the device 300.

Figure 4D:
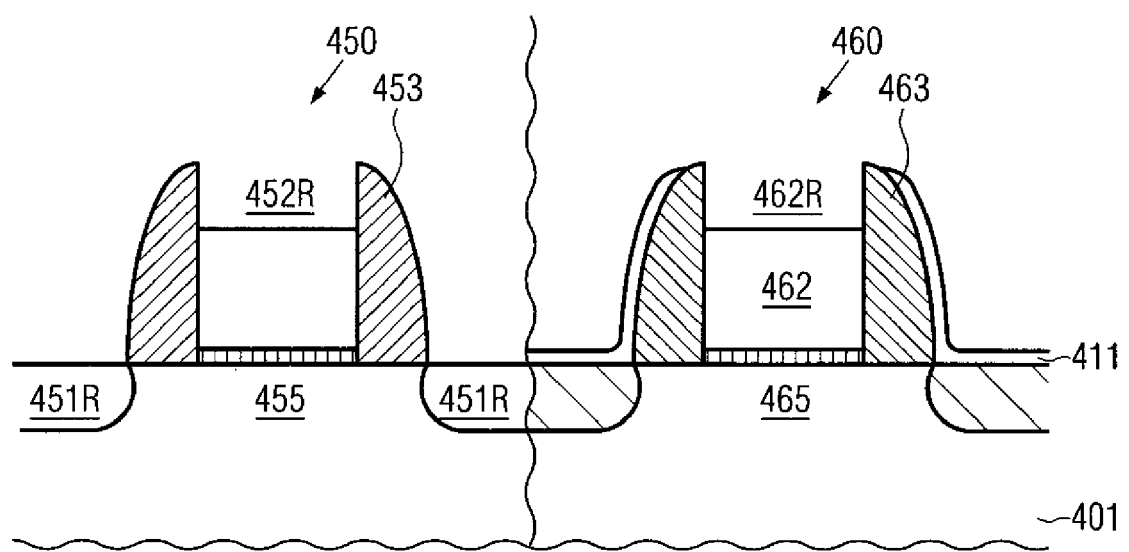

FIG. 4d schematically illustrates the semiconductor device 400 after the etch process 404. Consequently, the device 400 comprises respective recesses 452R and 451R in the gate electrode and the drain and source regions, respectively, of the transistor 450, while a recess 462R is formed in the gate electrode 462, while the carbon-containing regions 461C are maintained. In some illustrative embodiments, the previously performed process sequence 414, in combination with the etch process 404, may be designed such that at least a significant portion of the carbon-containing region 462C may be removed such that a desired amount of tensile stress may be created in the remaining recess 462R in a subsequent epitaxial growth process. In some illustrative embodiments, respective target values for process parameters are selected such that substantially all of the carbon-containing region 462C is removed during the etch process 404. Thereafter, the mask layer 411 and residues of the fill layer 412 may be removed and subsequently a selective epitaxial growth process may be performed, as is also previously described. Consequently, a strained silicon/germanium material may be formed in the recess 451R, thereby providing a desired uniaxial compressive strain in the transistor 450, when representing a P-channel transistor, while a stressed silicon/germanium material may be formed in the recesses 452R, 462R, thereby creating a biaxial strain in the transistors 450, 460, as is also previously explained. Thus, in combination with the previously formed silicon/carbon material in the transistor 460, a highly efficient increase of the electron mobility may be achieved. Thereafter, the further processing may be continued as previously described, wherein, for instance, additionally differently stressed dielectric layers may be formed above the transistors 450, 460, depending on process and device requirements.

As a result, the subject matter disclosed herein provides a technique for efficiently creating a biaxial strain in a channel region of a transistor by forming a recess in the gate electrode and refilling the recess, at least partially, with a stressed semiconductor material which may then induce the desired biaxial strain. Depending on the crystallographic configurations of the base material, the biaxial stress may be selected such that an enhancement of the charge carrier mobility may be accomplished, in particular when combined with additional strain-inducing sources. In some illustrative embodiments, the additional strain-inducing source may be a strained semiconductor material formed in the drain and source regions, wherein an additional increase of performance may be obtained due to the biaxial strain induced by the overlying stressed gate electrode. For example, silicon/germanium in the drain and source region may provide a substantially uniaxial compressive strain which may positively interact with the biaxial strain delivered by the gate electrode, thereby significantly enhancing the drive current capability of P-channel transistors. Similarly, for appropriate crystalline configurations, the biaxial strain induced by the stressed gate electrode may also enhance electron mobility, thereby providing an efficient means for simultaneously improving the charge carrier mobility of P-channel transistors and N-channel transistors. In some illustrative embodiments, the additional formation of an epitaxially grown semiconductor material may be accomplished without additional process steps with respect to conventional strategies in forming embedded semiconductor materials in the drain and source regions, thereby providing increased device performance without contributing to process complexity. In still other illustrative embodiments, a high degree of compatibility with conventional process strategies for forming strained channel regions may be accomplished, while nevertheless providing a significant performance increase.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first recess in a gate electrode and a second recess in drain and source regions of a first transistor in a common process;
   forming a third recess in a gate electrode of a second transistor while masking drain and source regions of said second transistor; and
   filling at least a portion of said first and third recesses with a conductive material having a biaxial tensile stress to induce a biaxial strain in a channel region of said first and second transistors.

2. The method of claim 1, further comprising filling said second recess with a first strained semiconductor material.

3. The method of claim 2, wherein said first, second and third recesses are formed and filled in a common process sequence.

4. The method of claim 1, wherein said gate electrode comprises silicon and said conductive material comprises silicon/germanium.

5. A method, comprising:
   forming a first recess in a gate electrode and a second recess in drain and source regions of a first transistor in a common process;
   forming a third recess in a gate electrode of a second transistor while masking drain and source regions of said second transistor; and
   forming a silicon/germanium material in said first, second, and third recesses by a selective epitaxial growth process.

6. The method of claim 5, wherein forming said first recess in said first transistor and said third recess in said second transistor comprises forming a mask layer above said first and second transistors, exposing a top surface of said gate electrodes of said first and second transistors and selectively removing said mask layer from said first transistor.

7. The method of claim 6, further comprising forming a second strained semiconductor material in said drain and source regions of said second transistor.

8. The method of claim 5, wherein said first transistor comprises a P-channel transistor, and the second transistor comprises an N-channel transistor.

* * * * *